US010665421B2

(12) United States Patent
Chen et al.

(10) Patent No.: US 10,665,421 B2
(45) Date of Patent: May 26, 2020

(54) IN-SITU BEAM PROFILE METROLOGY

(71) Applicant: APPLIED Materials, Inc., Santa Clara, CA (US)

(72) Inventors: Tsung-Liang Chen, Danvers, MA (US); Kevin R. Anglin, Somerville, MA (US); Simon Ruffell, Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/156,434

(22) Filed: Oct. 10, 2018

(65) Prior Publication Data
US 2020/0118790 A1 Apr. 16, 2020

(51) Int. Cl.
*H01J 37/20* (2006.01)
*H01J 37/08* (2006.01)
*H01J 37/244* (2006.01)

(52) U.S. Cl.
CPC .......... *H01J 37/244* (2013.01); *H01J 37/20* (2013.01); *H01J 2237/24564* (2013.01)

(58) Field of Classification Search
CPC ......... H01J 37/3005; H01J 2237/31749; H01J 37/08; H01J 2237/20228; H01J 2237/244; H01J 2237/2566; H01J 2237/2814; H01J 37/147; H01J 2237/08; H01J 2237/31755; H01J 37/21; H01J 37/256; H01J 37/261; H01J 2237/28; H01J 2237/2815; H01J 2237/30472; H01J 27/02; G01N 23/225; G01N 2201/129; G01N 23/2206

USPC ....... 250/492.21, 310, 306, 307, 309, 396 R, 250/282, 423 R, 491.1, 397, 424, 252.1, 250/442.11, 492.1
See application file for complete search history.

(56) References Cited

U.S. PATENT DOCUMENTS 4,081,674 A * 3/1978 Tamura ................ G01N 23/225
250/251
4,236,073 A * 11/1980 Martin .................... H01J 37/04
250/306
4,683,378 A * 7/1987 Shimase ............ H01J 37/3005
250/491.1

(Continued)

FOREIGN PATENT DOCUMENTS

JP 2008-519414 A 6/2008
WO 2008/053138 A1 5/2008

OTHER PUBLICATIONS

International Search Report and Written Opinion dated Jan. 28, 2020 in corresponding PCT application No. PCT/US2019/053942.

*Primary Examiner* — David A Vanore
(74) *Attorney, Agent, or Firm* — Nields, Lemack & Frame, LLC

(57) ABSTRACT

A system for determining various parameters of an ion beam is disclosed. A test workpiece may be modified to incorporate a detection pattern. The detection pattern may be configured to measure the height of the ion beam, the uniformity of the ion beam, or the central angle of the ion beam. In certain embodiments, the amount of current striking the detection pattern may be measured using an optical emission spectrometer (OES) system. In other embodiments, a power supply used to bias the workpiece may be used to measure the amount of current striking the detection pattern. Alternative, the detection patterns may be incorporated into the workpiece holder.

32 Claims, 9 Drawing Sheets

(56) References Cited

U.S. PATENT DOCUMENTS

| | | | | |
|---|---|---|---|---|
| 4,874,947 A * | 10/1989 | Ward | H01J 37/3005 | 850/1 |
| 5,331,161 A * | 7/1994 | Ohdomari | H01J 37/265 | 250/397 |
| 5,412,210 A * | 5/1995 | Todokoro | G01B 15/04 | 250/306 |
| 6,066,956 A * | 5/2000 | Nikawa | G01R 31/311 | 324/754.23 |
| 6,335,532 B1 * | 1/2002 | Tanaka | H01J 37/21 | 250/397 |
| 6,387,807 B1 * | 5/2002 | Faubert | H01L 21/3212 | 257/E21.304 |
| 6,541,770 B1 * | 4/2003 | Veneklasen | G01N 23/203 | 250/310 |
| 6,630,681 B1 * | 10/2003 | Kojima | B82Y 10/00 | 250/282 |
| 6,768,324 B1 * | 7/2004 | Yamada | G01R 31/307 | 324/754.22 |
| 6,953,942 B1 * | 10/2005 | Graf | H01J 37/302 | 250/442.11 |
| 7,351,983 B2 | 4/2008 | Sakaguchi | H01J 37/09 | 250/396 R |
| 7,485,873 B2 * | 2/2009 | Ward | B82Y 10/00 | 250/423 F |
| 7,531,469 B2 * | 5/2009 | Ramaswamy | C23C 14/48 | 427/523 |
| 7,557,358 B2 * | 7/2009 | Ward | B82Y 10/00 | 250/423 F |
| 7,666,464 B2 * | 2/2010 | Collins | C23C 14/48 | 427/523 |
| 7,871,828 B2 * | 1/2011 | Cho | C23C 16/52 | 257/E21.528 |
| 8,653,458 B2 * | 2/2014 | Gunji | H01J 37/1474 | 250/306 |
| 8,822,911 B2 * | 9/2014 | Sugiyama | H01J 3/14 | 250/252.1 |
| 9,515,166 B2 * | 12/2016 | Nemani | H01L 21/0228 | |
| 10,304,657 B2 * | 5/2019 | Shichi | H01J 37/28 | |
| 10,436,698 B2 * | 10/2019 | Bandura | H01J 49/04 | |
| 2003/0001109 A1 * | 1/2003 | Morio | H01J 37/3045 | 250/492.21 |
| 2005/0037143 A1 * | 2/2005 | Chou | B29C 43/021 | 427/248.1 |
| 2005/0092922 A1 * | 5/2005 | Muto | H01J 37/3005 | 250/309 |
| 2005/0218344 A1 * | 10/2005 | Starcher | H01J 37/026 | 250/492.21 |
| 2006/0043280 A1 * | 3/2006 | Feldbaum | H01L 21/31116 | 250/282 |
| 2006/0097195 A1 | 5/2006 | Angel et al. | | |
| 2008/0061250 A1 | 3/2008 | Perel et al. | | |
| 2008/0073528 A1 * | 3/2008 | Sasaki | H01J 37/265 | 250/307 |
| 2008/0073582 A1 * | 3/2008 | Shichi | H01J 37/20 | 250/492.21 |
| 2009/0272899 A1 * | 11/2009 | Yamazaki | H01J 37/28 | 250/307 |
| 2012/0045615 A1 * | 2/2012 | Kirkpatrick | H01J 37/05 | 428/141 |
| 2012/0193550 A1 * | 8/2012 | Tsuji | F16F 1/50 | 250/396 R |
| 2013/0146763 A1 * | 6/2013 | Kawada | H01J 37/222 | 250/306 |
| 2013/0175445 A1 * | 7/2013 | Kim | H01J 37/08 | 250/310 |
| 2013/0204531 A1 * | 8/2013 | McManus | G01N 21/718 | 702/2 |
| 2013/0284924 A1 * | 10/2013 | Mizuochi | G01N 23/2206 | 250/310 |
| 2014/0021346 A1 * | 1/2014 | Stoks | G01N 23/225 | 250/307 |
| 2015/0001418 A1 | 1/2015 | Ido et al. | | |
| 2015/0200073 A1 * | 7/2015 | Jen | H01J 37/3171 | 250/282 |
| 2015/0270140 A1 * | 9/2015 | Gupta | H01L 21/32136 | 216/67 |
| 2015/0311073 A1 * | 10/2015 | Srinivasan | H01L 29/0684 | 438/504 |
| 2016/0254122 A1 * | 9/2016 | Wu | H01J 37/3172 | 250/492.21 |
| 2017/0005013 A1 * | 1/2017 | Evans | H01L 21/28506 | |
| 2017/0343340 A1 * | 11/2017 | Kawada | G01B 15/00 | |
| 2018/0068828 A1 * | 3/2018 | Halling | H01J 37/3171 | |
| 2018/0143110 A1 * | 5/2018 | Delpy | G01N 1/06 | |
| 2018/0197796 A1 * | 7/2018 | Evans | H01L 22/26 | |
| 2018/0218878 A1 * | 8/2018 | Xu | H01J 37/28 | |

* cited by examiner

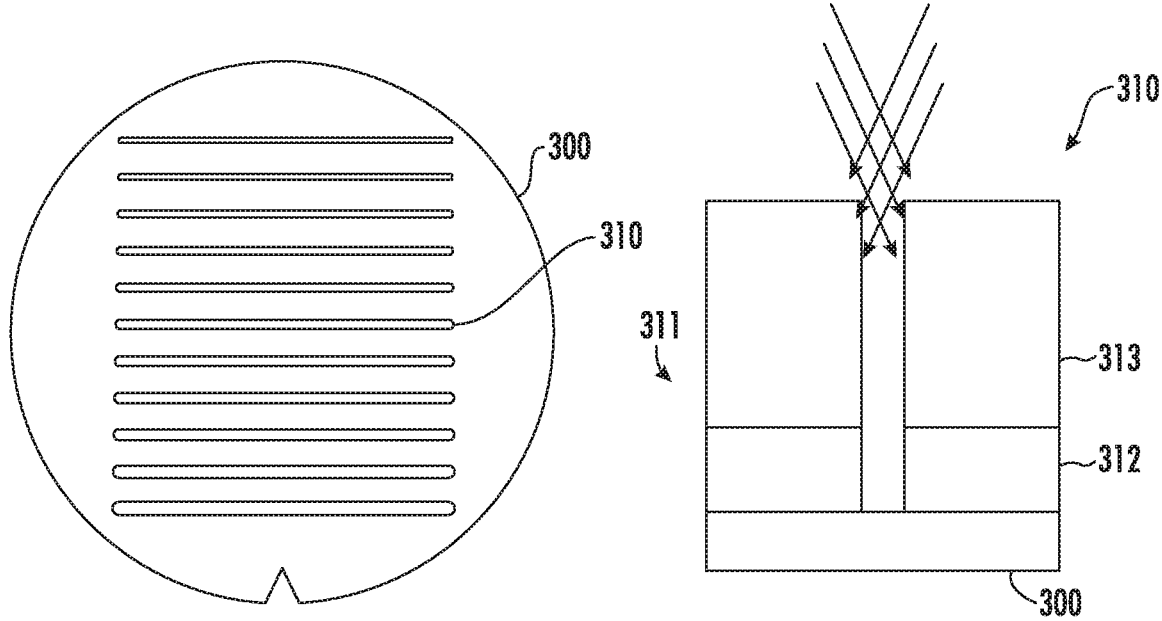
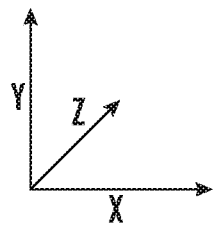
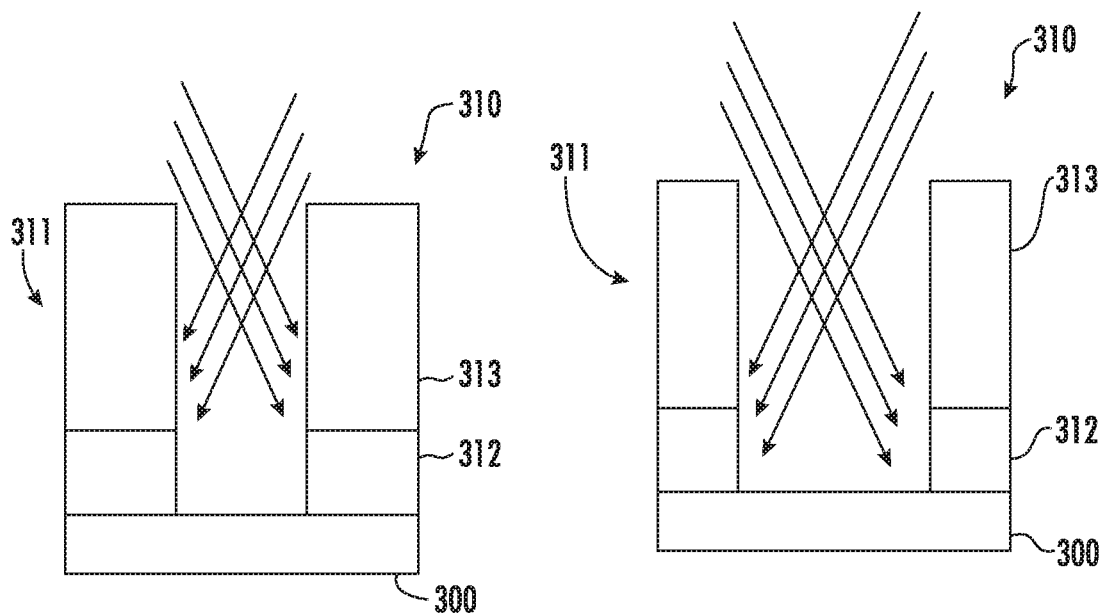
FIG. 3A  FIG. 3B  FIG. 3C  FIG. 3D

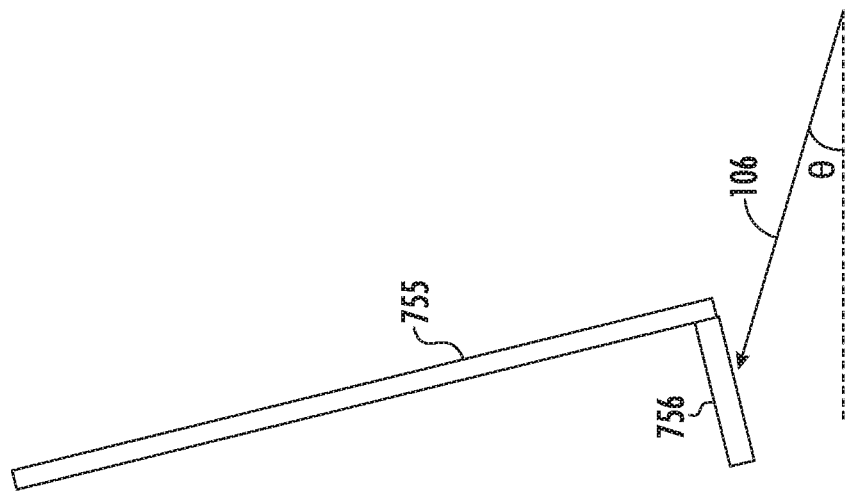
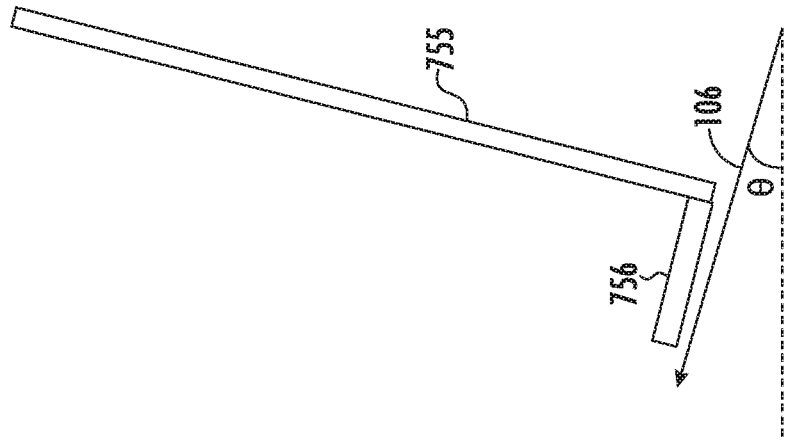
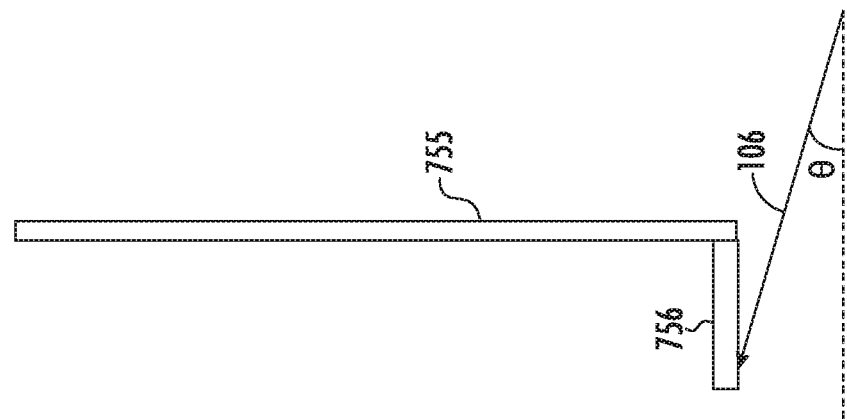

IN-SITU BEAM PROFILE METROLOGY

FIELD

This disclosure related to a system and method of determining characteristics of an ion beam, and more specifically, determining the characteristics of the ion beam without the use of Faraday devices.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on an extraction plate. The ions are attracted to a workpiece that is scanned relative to the extraction aperture. These ions may be used to implant a dopant in the workpiece, etch the workpiece, deposit a coating on the workpiece or amorphize the workpiece.

To properly process the workpiece, it is desirable to characterize the ion beam. For example, beam height, beam angle, and beam uniformity may be parameters that are beneficial to determine prior to processing the workpiece. Traditionally, these parameters are determined through the use of Faraday devices. Briefly, an array of Faraday devices is arranged in a location in the processing chamber where the ion beam strikes. By measuring the current collected in each device, it is possible to determine certain parameters associated with the ion beam.

However, recently, it has become more common to use electrically insulating components within the processing chamber. These electrically insulating components may affect the precision of the Faraday devices, especially if the insulating material is disposed in close proximity to the Faraday devices.

Therefore, it would be beneficial if there were a system and method for performing in-situ ion beam profile metrology without the use of Faraday devices. Further, it would be advantageous if this system performed characterization of multiple parameters of the ion beam.

SUMMARY

A system for determining various parameters of an ion beam is disclosed. A test workpiece may be modified to incorporate a detection pattern. The detection pattern may be configured to measure the height of the ion beam, the uniformity of the ion beam, or the central angle of the ion beam. In certain embodiments, the amount of current striking the detection pattern may be measured using an optical emission spectrometer (OES) system. In other embodiments, a power supply used to bias the workpiece may be used to measure the amount of current striking the detection pattern. Alternatively, the detection patterns may be incorporated into the workpiece holder.

According to a first embodiment, a workpiece processing system is disclosed. The workpiece processing system comprises an ion source, emitting an ion beam; a workpiece holder, configured so as to have relative movement between the workpiece holder and the ion beam; a test workpiece disposed on the workpiece holder, having a detection pattern, wherein the detection pattern is made of a material different than the test workpiece; and a measuring system for determining an amount of current from the ion beam striking the detection pattern, wherein an output from the measuring system is used to measure a parameter of the ion beam. In certain embodiments, the measuring system comprises an optical emission spectrometer (OES) system. In certain embodiments, the measuring system comprises a workpiece bias power supply used to bias the test workpiece. In some embodiments, the workpiece bias power supply provides an indication of charge accumulated on the test workpiece, wherein the indication of charge is representative of the amount of current from the ion beam striking the detection pattern. In some embodiments, the workpiece bias power supply provides an indication of current flowing to or from the workpiece bias power supply, and the indication of current is representative of the amount of current from the ion beam striking the detection pattern. In certain embodiments, the detection pattern comprises a horizontal detection stripe and the parameter comprises a height of the ion beam. In certain embodiments, the detection pattern comprises a plurality of detection areas, and the parameter comprises a uniformity of the ion beam. In certain embodiments, the detection areas are non-overlapping in vertical and horizontal directions. In certain embodiments, the detection pattern comprises trenches of varying aspect ratios, and the parameter comprises a central angle of the ion beam. In certain embodiments, the test workpiece comprises silicon and the detection pattern comprises silicon oxide or silicon nitride.

According to a second embodiment, a workpiece processing system is disclosed. The workpiece processing system comprises an ion source, emitting an ion beam; a workpiece holder, configured so as to have relative movement between the workpiece holder and the ion beam, and having a detection pattern, wherein the detection pattern is made of a material different than the workpiece holder; and a measuring system for determining an amount of current from the ion beam striking the detection pattern, wherein an output from the measuring system is used to measure a parameter of the ion beam. In certain embodiments, the measuring system comprises an optical emission spectrometer (OES) system. In certain embodiments, the measuring system comprises a workpiece bias power supply used to bias the workpiece holder. In some embodiments, the workpiece bias power supply provides an indication of charge accumulated on the workpiece holder, wherein the indication of charge is representative of the amount of current from the ion beam striking the detection pattern. In some embodiments, the workpiece bias power supply provides an indication of current flowing to or from the workpiece bias power supply, and the indication of current is representative of the amount of current from the ion beam striking the detection pattern. In certain embodiments, the detection pattern comprises a horizontal detection stripe and the parameter comprises a height of the ion beam. In certain embodiments, the detection pattern comprises a plurality of detection areas, and the parameter comprises a uniformity of the ion beam. In certain embodiments, the detection areas are non-overlapping in vertical and horizontal directions. In certain embodiments, the detection areas comprise trenches of varying aspect ratios, and the parameter comprises a central angle of the ion beam. In certain embodiments, the detection pattern comprises a leg disposed perpendicular to a surface of the workpiece holder, and the parameter comprises a central angle of the ion beam.

According to another embodiment, a method of determining a parameter of an ion beam is disclosed. The method comprises scanning a structure having a detection pattern in front of the ion beam, wherein the detection pattern is made of a different material than the structure; measuring an amount of current from the ion beam striking the detection pattern; and determining the parameter based on the amount of current striking the detection pattern as a function of scan position. In certain embodiments the structure comprises a silicon workpiece. In certain embodiments, the structure comprises a workpiece holder. In some embodiments, the current is measured using an OES system. In some embodiments, the current is measured using a workpiece bias power supply. In certain embodiments, the parameter is selected from the group consisting of height, uniformity and central angle.

BRIEF DESCRIPTION OF THE FIGURES

For a better understanding of the present disclosure, reference is made to the accompanying drawings, which are incorporated herein by reference and in which:

FIG. 3A is a top view of a workpiece used to determine the central angle of an ion beam;

FIGS. 3B-3D are side views of the workpiece of FIG. 3A showing trenches of varying widths;

FIGS. 8A-8C are side views with the workpiece holder disposed at different angles.

DETAILED DESCRIPTION

Figure 1:
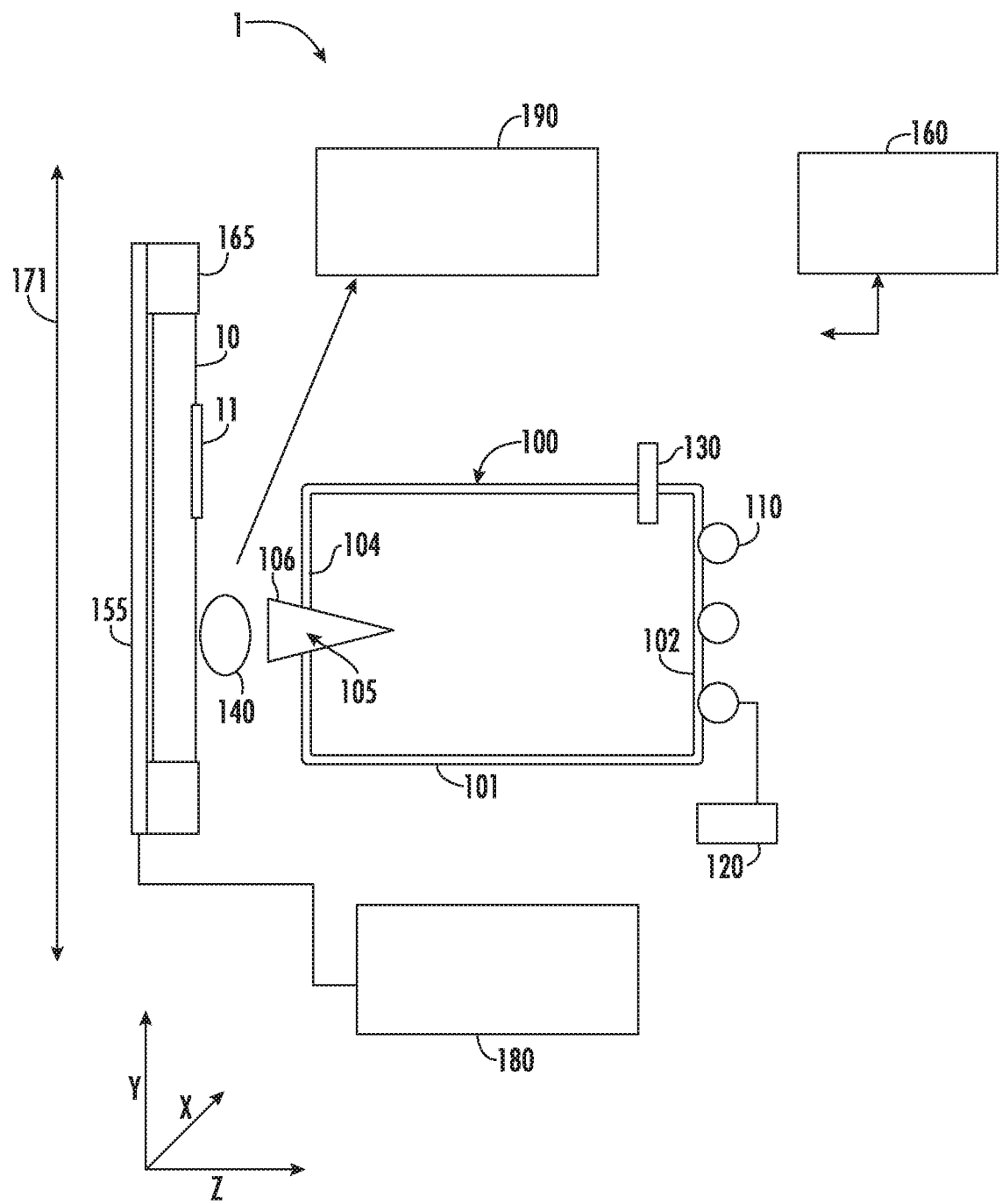
FIG. 1 is a view of the ion source according to one embodiment.

As described above, profiling of an ion beam is typically performed using Faraday devices. However, when insulating components are included in the process chamber, the accuracy and precision of these Faraday devices may be degraded. FIG. 1 shows a first embodiment of a system that overcomes this issue.

The system 1 includes an ion source, which includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of a first dielectric wall 102. The RF antenna 110 may be powered by a RF power supply 120. The energy delivered to the RF antenna 110 is radiated within the ion source chamber 100 to ionize a feed gas, which is introduced via gas inlet 130.

One chamber wall, referred to as the extraction plate 104 includes an extraction aperture 105 through which an ion beam 106 may exit the ion source chamber 100. The ion beam 106 may be much wider in the horizontal direction, also referred to as the X direction, than the height direction. An ion beam having these characteristics may be referred to as a ribbon ion beam. The extraction plate 104 may be constructed of an electrically conductive material, such as titanium, tantalum or another metal. The extraction plate 104 may be in excess of 300 millimeters in width. Further, the extraction aperture 105 may be wider in the X direction than the diameter of the workpiece 10. This extraction plate 104 may be biased at an extraction voltage. In other embodiments, the extraction plate 104 may be grounded.

A workpiece holder 155 may be disposed proximate the extraction aperture 105. A workpiece 10 may be disposed on the workpiece holder 155. The workpiece 10 may have a detection pattern 11, as described in more detail below. The workpiece holder 155 is scanned using a scan motor, which moves in the vertical direction 171. This direction is also referred to as the Y direction. In other embodiments, the workpiece holder 155 may not be movable. For example, the workpiece holder 155 may be stationary while the ion source chamber 100 is moved. In another embodiment, both the workpiece holder 155 and the ion source chamber 100 may be moved. Thus, the workpiece holder 155 is configured so that there is relative vertical movement between the ion beam 106 and the workpiece holder 155.

Surrounding the workpiece 10 is a shield 165, which may also be referred to as a halo. The shield 165 surrounds the workpiece 10 and has an opening in its center, which corresponds to the location of the workpiece 10. The shield 165 may be constructed of an electrically conductive material, such as a metal. The shield 165 may be made of titanium, silicon, silicon carbide or another material. The shield 165 may be considered to be part of the workpiece holder 155.

The shield 165 and workpiece holder 155 may be biased using a workpiece bias power supply 180. In certain embodiments, the output from the workpiece bias power supply 180 is a pulsed DC voltage, having a frequency of between 5 kHz and 50 kHz and an amplitude of 100 to 5,000 volts.

While the above disclosure describes the output from the workpiece bias power supply 180 as being a pulsed DC voltage, it is understood that the workpiece bias power supply 180 may be constant, while an extraction voltage power supply, which biases the extraction plate 104, provides a pulsed DC output.

When pulsed, the voltage applied to the workpiece holder 155 and the shield 165 is more negative than the voltage applied to the extraction plate 104. In other words, if the extraction plate 104 is grounded, the workpiece bias power supply 180 generates negative pulses. During these negative pulses, positive ions are attracted from the interior of the ion source chamber 100 to the workpiece 10. If the extraction plate 104 is positively biased, the workpiece bias power supply 180 generates less positive or negative pulses, such that positive ions are attracted from the interior of the ion source chamber 100 to the workpiece 10 during these pulses.

In certain embodiments, the system 1 also includes an OES (optical emission spectrometer) system 190. The OES system 190 is capable of detecting the composition of a plasma 140 based on the optical emissions from that plasma 140. For example, the ions in the plasma 140 may emit a unique emission spectrum specific to each element. The OES system 190 may determine the elements contained within the plasma 140 based on this emission spectrum. In other embodiments, the OES system 190 is not employed.

A controller 160 may be in communication with the workpiece bias power supply 180, the workpiece holder 155, the OES system 190, and other components. The controller 160 may include a processing unit, such as a microcontroller, a personal computer, a special purpose controller, or another suitable processing unit. The controller 160 may also include a non-transitory storage element, such as a semiconductor memory, a magnetic memory, or another suitable memory. This non-transitory storage element may contain instructions and other data that allows the controller 160 to perform the functions described herein. The controller 160 may be capable of controlling the movement of the workpiece holder 155 and knowing the position of the workpiece holder 155 relative to the ion beam. This position may also be referred to as the scan position. The controller 160 also can receive information from the OES system 190 and from the workpiece bias power supply 180.

Figure 2A:
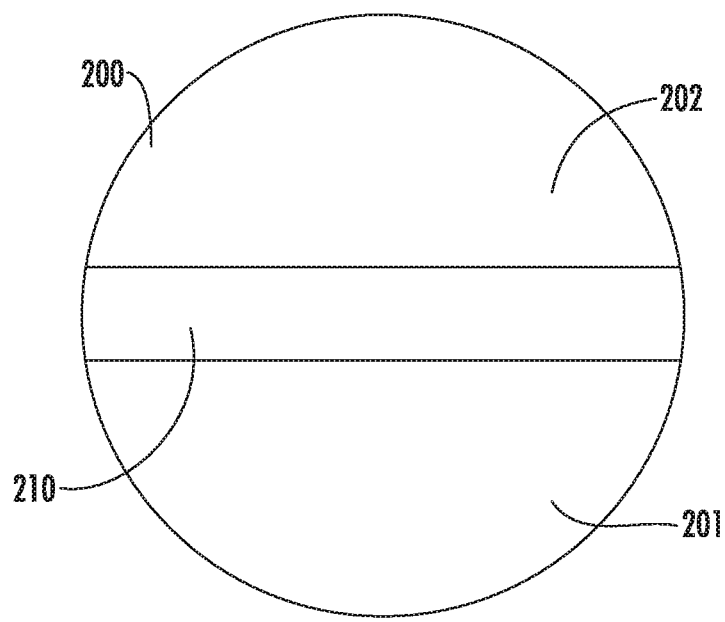
FIG. 2A is a top view of a workpiece used to determine the height of an ion beam.

In one embodiment, the workpiece 10 may be a test workpiece. This test workpiece may be disposed on the workpiece holder 155. The test workpiece 200 may be a silicon workpiece having a detection pattern, such as a horizontal detection stripe 210, as shown in FIG. 2A. This horizontal detection stripe 210 may be made from a different material. For example, the test workpiece 200 may be silicon, while the horizontal detection stripe 210 may comprise silicon oxide or silicon nitride. Of course, the test workpiece 200 may be made of a different material. In one embodiment, the horizontal detection stripe 210 may be the same height as the ion beam 106. In another embodiment, the horizontal detection stripe 210 may be taller than the height of the ion beam 106. In yet another embodiment, the horizontal detection stripe 210 may be smaller than the height of the ion beam 106.

As the test workpiece 200 is moved past the ion beam 106, the ion beam 106 strikes different portions of the test workpiece 200. For example, as the workpiece holder 155 moved downward relative to the ion beam 106 in vertical direction 171, the ion beam 106 first strikes the lower portion 201 of the test workpiece 200, then the ion beam 106 strikes the horizontal detection stripe 210, and finally the ion beam 106 strikes the upper portion 202 of the test workpiece 200.

As the ion beam 106 strikes the test workpiece 200, ions penetrate the test workpiece 200, imparting a charge in the test workpiece 200. The charge imparted to the test workpiece 200 may be different when the ion beam 106 is striking the horizontal detection stripe 210. For example, less charge may be imparted to the workpiece when the ion beam 106 strikes the horizontal detection stripe 210. In a different embodiment, more charge may be imparted to the workpiece when the ion beam 106 strikes the horizontal detection stripe 210.

Thus, as the ion beam 106 moves relative to the test workpiece 200 in direction 171, the average charge imparted to the test workpiece 200 changes as the ion beam 106 encounters the horizontal detection stripe 210. This charge may be detected by the workpiece bias power supply 180. For example, the change in charge may result in a change in the current flowing to or from the workpiece bias power supply 180. The controller 160 may receive this data from the workpiece bias power supply 180. In certain embodiments, this data comprises the amount of current flowing to or from the workpiece bias power supply 180. In another embodiment, this data comprises the amount of charge detected by the workpiece bias power supply 180. Thus, it is possible from the controller 160 to create a plot or table that correlates scan position in the vertical direction 171 with the average charge (or current) imparted by the ion beam 106.

If the ion beam 106 is very narrow in the height direction, the change in charge will be abrupt and roughly correspond to the position of the horizontal detection stripe 210. However, if the ion beam 106 is wider in the height direction, the change in charge will be more gradual and will begin prior to the location of the horizontal detection stripe 210. The onset of the change in charge corresponds to the scan position where the ion beam 106 first impacts the horizontal detection stripe 210. Thus, the width of the ion beam 106 may be determined based on the equation:

$$\text{Position(onset of change in charge)}-\text{Position(horizontal detection stripe)}=0.5*\text{Height of ion beam}$$

Of course, other equations may also be used by the controller 160 to determine the height of the ion beam 106. For example, in another embodiment, the rate of change in the charge may be used to determine the height of the ion beam 106. In another embodiment, the change in current passing between the workpiece bias power supply 180 and the workpiece 10 may be used to determine the height of the ion beam 106.

In this embodiment, the workpiece bias power supply 180 is able to detect the change in charge of the test workpiece 200. However, in another embodiment, the OES system 190 is used.

For example, as the ion beam 106 strikes the lower portion 201 of the test workpiece 200, the plasma 140 may contain the elements found in the ion beam 106 and the elements found in the test workpiece 200. For example, the ion beam 106 may be argon and the test workpiece 200 may be silicon, thus, the plasma 140 may contain ions of argon and silicon. Thus, the spectral emissions will correspond to these elements.

When the ion beam 106 strikes the horizontal detection stripe 210, the plasma 140 may contain the elements of the ion beam 106 and the elements of the horizontal detection stripe 210. If the horizontal detection stripe 210 is made of silicon oxide, the plasma 140 will contain argon, silicon and oxygen. This information may be passed from the OES system 190 to the controller 160. Thus, the controller 160 may determine when the ion beam 106 first strikes the horizontal detection stripe 210 by the presence of oxygen in the plasma 140. If the horizontal detection stripe 210 is made of silicon nitride, the presence of nitrogen will indicate when the ion beam 106 first strikes the horizontal detection stripe 210. Likewise, if the horizontal detection stripe 210 is made of some other element, the presence of that element may be used to determine the scan position where the ion beam 106 first strikes the horizontal detection stripe 210.

If the ion beam 106 is very narrow in the height direction, the change in the oxygen level in the plasma 140 will be abrupt and roughly correspond to the position of the horizontal detection stripe 210. However, if the ion beam 106 is wider in the height direction, the change in the oxygen level in the plasma 140 will be more gradual and will begin prior to the location of the horizontal detection stripe 210. The onset of the change in the oxygen level in the plasma 140 corresponds to the scan position where the ion beam 106 first impacts the horizontal detection stripe 210. Thus, the width of the ion beam 106 may be determined by the controller 160 based on the equation:

$$\text{Position(onset of change in the oxygen level in the plasma)}-\text{Position(horizontal detection stripe)}=0.5*\text{Height of ion beam}$$

Of course, the above description relates to a silicon workpiece with a horizontal detection stripe 210 made of silicon oxide. As stated above, if the horizontal detection stripe 210 is comprised of a different material, the spectrum emitted will reflect the elements unique to that horizontal detection stripe 210. For example, if the horizontal detection stripe 210 is made of silicon nitride, the OES system 190 will be used to detect the presence of nitrogen.

Thus, the system 1 of FIG. 1 employs two different methods that may be used to determine the height of the ion beam 106 using the test workpiece 200 shown in FIG. 2A. One method uses the charge or current measurement from the workpiece bias power supply 180 to determine when the ion beam 106 is striking the horizontal detection stripe 210. The second method uses an OES system 190 to determine when the ion beam 106 is striking the horizontal detection stripe 210. Note that neither method relies on Faraday devices.

Further, it is understood that the system 1 of FIG. 1 may only employ one of these two methods. For example, in certain embodiments, the OES system 190 is not used. In other embodiments, the workpiece bias power supply 180 may not provide charge or current information to the controller 160.

The use of a change in charge or a change in the spectral emission may be used to determine other parameters of the ion beam 106 as well.

Figure 2B:
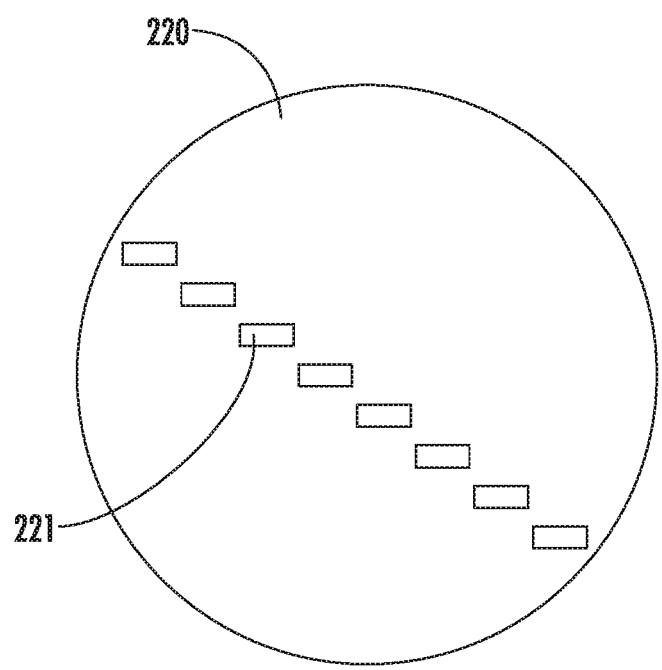
FIG. 2B is a top view of a workpiece used to determine the uniformity of an ion beam.

FIG. 2B shows a test workpiece 220 having a detection pattern that comprises a plurality of detection areas 221 that are made of a different material. For example, as was described with respect to the test workpiece 200 in FIG. 2A, the test workpiece 220 may be silicon while the detection areas 221 may be silicon oxide or silicon nitride.

As was described above, when the ion beam 106 strikes the detection areas 221, the amount of charge imparted to the test workpiece 220 may be different than when the ion beam 106 strikes other regions of the test workpiece 220. Similarly, the spectral emission detected by the OES system 190 may be different when the ion beam 106 strikes the detection areas 221. As described above, the controller 160 may be in communication with the workpiece bias power supply 180 and/or the OES system 190 in order to perform the operations disclosed herein.

In one embodiment, the detection areas 221 may be non-overlapping in the horizontal and vertical directions, i.e. the X and Y directions, respectively. If the detection areas 221 are non-overlapping in the vertical direction, as the workpiece holder 155 is moved relative to the ion beam 106 along direction 171, only one detection area 221 is exposed to the ion beam 106 at a time. Furthermore, if the detection areas 221 are non-overlapping in the horizontal direction, each portion of the ion beam 106 strikes only one of these detection areas 221. For example, the ion beam 106 may be divided into a plurality of horizontal segments, where the totality of these horizontal segments represents an entirety of the ion beam 106 that strikes the test workpiece 220.

In this way, for each scan position in the vertical direction, there is exactly one horizontal segment of the ion beam 106 that strikes a detection area 221.

As described above, the workpiece bias power supply 180 may have the ability to detect the change in the charge imparted to the workpiece 10 and relay this information to the controller 160. Thus, as the workpiece holder 155 moves the workpiece 10 relative to the ion beam 106 in direction 171, the workpiece bias power supply 180 determines the charge imparted to the workpiece 10. From this, the amount of beam current that strikes each detection area 221 can be determined. If a workpiece, such as test workpiece 220 is employed, the change in charge reflects the beam current in each horizontal segment as the workpiece is moved vertically relative to the ion beam 106 in direction 171. By comparing the charge imparted for each of the detection areas 221, it is possible to determine the beam current for that horizontal segment of the ion beam 106. This information can then be used to determine the uniformity of the ion beam 106.

As an example, if each detection area 221 is exactly the same size in the X and Y directions, the amount of charge impacted onto the test workpiece 220 as it is scanned in direction 171 would be constant, if the ion beam 106 had perfect uniformity. If the ion beam 106 outputs more current near its horizontal center, then as the scan position of the test workpiece 220 approaches the vertical center of the test workpiece 220, a change on the charge may be detected.

Alternatively, as described above, the system 1 may include an OES system 190, which captures the spectral emission from the plasma 140. Thus, as the workpiece holder 155 moves the workpiece relative to the ion beam 106 in direction 171, the OES system 190 determines the spectral emissions from the plasma 140. This information may be transmitted to the controller 160 where the amount of beam current that strikes each detection area 221 can be determined. If a workpiece such as test workpiece 220 is employed, the spectral emissions reflect the beam current in each horizontal segment as the workpiece is moved vertically relative to the ion beam 106 in direction 171. By comparing the outputs of the OES system 190 for each of the detection areas 221, it is possible for the controller 160 to determine the beam current for that horizontal segment of the ion beam 106. This information can then be used to determine the uniformity of the ion beam 106.

While FIG. 2B shows a test workpiece 220 where the detection areas 221 are arranged in a diagonal pattern, other embodiments are possible. As described above, in one embodiment, any embodiment where the detection areas 221 do not overlap in the vertical or horizontal directions may be used. Preferably, the detection areas 221 cover an entirety of the test workpiece 220 in the horizontal direction. Thus, in certain embodiments, the outermost detection areas 221 may appear close to the vertical center of the test workpiece 220, as the test workpiece 220 is widest in this region.

Although calculations may be easier if the detection areas 221 are non-overlapping, other embodiments are possible. For example, assume that, in the first row, detection areas are disposed in horizontal segments 1 and 2; in the second row, detection areas are disposed in horizontal segments 1 and 3; and in the third row, detection areas are disposed in horizontal segments 2 and 3. The beam current in each of the horizontal segments can be determined using matrix operations or some other algorithm. Thus, the detection areas 221 need not be non-overlapping, rather the detection areas may be configured in any manner that makes it possible to determine the beam current for each horizontal segment of the ion beam 106.

Thus, the system 1 of FIG. 1 also shows two different mechanisms that allow the uniformity of an ion beam 106 to be determined. One method uses the charge measurement from the workpiece bias power supply 180 to determine how much beam current is striking each detection area 221. The second method uses an OES system 190 to determine the amount of beam current striking each detection area 221. Note that neither method relies on Faraday devices. This information may then be used to determine the uniformity of the ion beam 106.

Further, it is understood that the system 1 of FIG. 1 may only employ one of these two methods. For example, in certain embodiments, the OES system 190 is not used. In other embodiments, the workpiece bias power supply 180 may not provide charge or current information to the controller 160.

FIG. 3A shows a top view of test workpiece 300 that may be employed to find the central angle of an ion beam 106. The central angle is defined as the angle of the ion beam relative to perpendicular to the plane of the workpiece. Thus, an ion beam that perpendicularly strikes the workpiece has a central angle of 0°. The test workpiece 300 may also be used with the system 1 of FIG. 1.

The test workpiece 300 has a plurality of trenches 310, which range from narrow, as shown in FIG. 3B to wide, as shown in FIG. 3D. Further, trenches having intermediate widths, such as that shown in FIG. 3C are also disposed on the test workpiece 300. This series of trenches may be considered to be a detection pattern.

In one embodiment, which is demonstrated in FIG. 3A, each trench 310 is wider than the one directly above it in the Y direction. Each trench 310, such as the one shown in FIG. 3D, comprises two walls 311. The lower portion 312 of the wall 311 is made of a different material than the top portion 313 of the wall 311. Additionally, the top portion 313 of the wall 311 may be constructed from the same material as the remainder of the test workpiece 300.

FIGS. 3B-3D show trenches 310 of varying widths, each being impacted by an ion beam 106 having a predetermined central angle. Note that in the trench 310 of FIG. 3B, the aspect ratio of the trench 310, defined as its depth divided by its width is very high. Thus, ion beams having a large central angle will not reach the lower portion 312 of the wall 311. More specifically, if the trench 310 has a depth D and a width W, for an ion beam to strike the bottom of the wall 311, the central angle ($\theta$) of the ion beam 106 may satisfy the equation: $\tan(\theta) < W/D$. If the lower portion 312 has a height H, then for an ion beam to strike the lower portion 312 of the wall 311, the central angle ($\theta$) of the ion beam 106 may satisfy the equation: $\tan(\theta) < W/(D-H)$.

In other words, ions will not strike the lower portion 312 of the wall 311 if the central angle is sufficiently large. Note that the trench 310 of FIG. 3C has a smaller aspect ratio. Thus, ion beams 106 that have the same predetermined central angle will reach deeper into the trench 310, striking the walls 311 at a lower position. In certain embodiments, this lower position may include the lower portion 312. The trench 310 of FIG. 3D has an even smaller aspect ratio. In this case, the ion beams 106 having the same predetermined central angle impact the lower portion 312 of the wall 311.

Figure 4A:
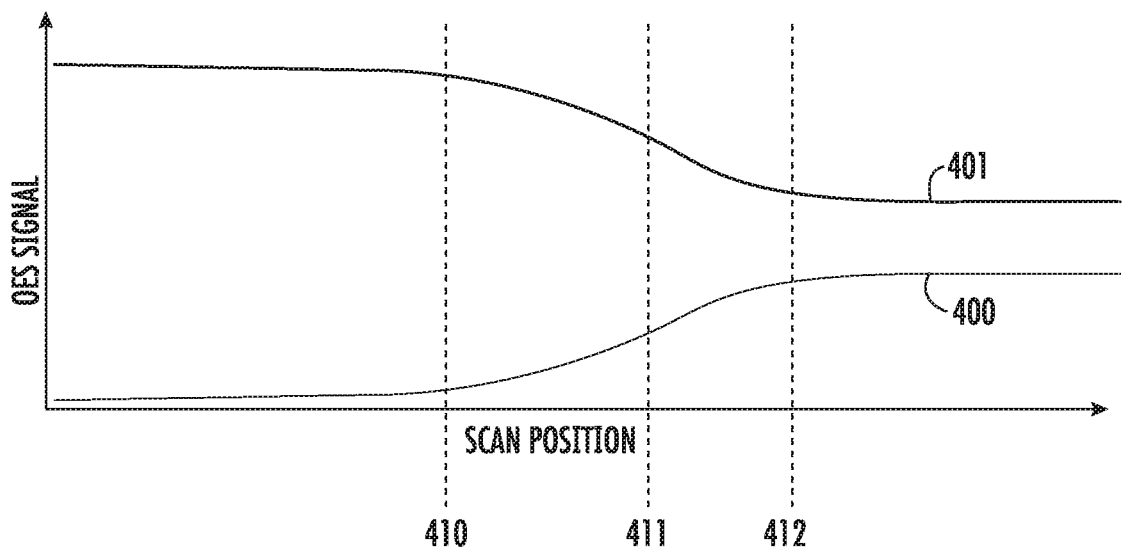
FIG. 4A shows the OES output for oxygen and silicon as a function of scan position for the workpiece of FIG. 3A.

Stated differently, as the aspect ratio of the trench 310 decreases, ion beams strike further down in the trenches, eventually impacting the lower portion 312. Since the lower portion 312 is constructed of a different material, the spectral emission pattern of the plasma 140 will change when the lower portion 312 is impacted. FIG. 4A shows a representative graph of the spectral emission of the plasma 140 as the test workpiece 300 is scanned upward relative to the ion beam 106 in direction 171 and exposed to the ion beam 106. Line 400 shows the spectral emission of oxygen and line 401 shows the spectral emission of silicon. As the ion beam 106 strikes the test workpiece 300 in the areas where the trenches 310 have a high aspect ratio, the ion beam 106 does not impact the lower portion 312 at all. Thus, the spectral emissions show a high level of silicon and a very low level of oxygen, as shown at scan position 410. As the test workpiece 300 is moved upward relative to the ion beam 106, the aspect ratio of the trenches 310 decreases, allowing some ions to reach the lower portion 312. Thus, as shown in scan position 411, there is some oxygen in the spectral emissions of the plasma 140. As the test workpiece 300 continues moving upward relative to the ion beam 106, the aspect ratio of the trenches 310 decreases, allowing more ions to reach the lower portion 312. In fact, there is an aspect ratio at which a further decrease in that aspect ratio does not increase the amount of ions that strike the lower portion 312. Thus, as scan position 412 continues to move upward, the oxygen levels reach a point near the maximum.

Figure 4B:
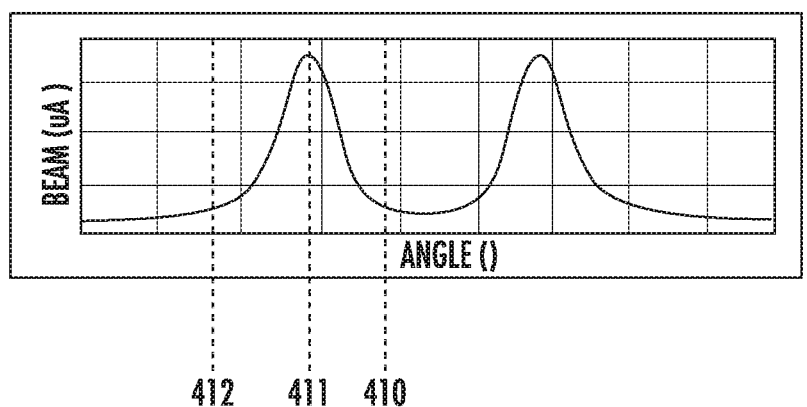
FIG. 4B shows the beam current as a function of central angle derived from the OES output shown in FIG. 4A.

At each scan position, the controller 160 may determine the maximum central angle to reach the lower portion 312. If the scan positions are converted to central angles, and the derivative of the line 400 is taken, the graph shown in FIG. 4B is obtained. The points corresponding to scan positions 410, 411, 412 are also shown in FIG. 4B. At scan position 410, the angle is too large for ions to reach the lower portion 312. At scan position 412, a decrease in aspect ratio has no effect, indicating that central angle is small enough to reach the bottom of the trench 310. At scan position 411, the change in the amount of oxygen in the OES signal is the greatest, indicating that this is the mean central angle. This graph demonstrates that the central angle of an ion beam 106 may be determined based on the output of the OES system 190 using test workpiece 300.

The description of the use of the test workpiece 300 may also apply to a system that uses the workpiece bias power supply 180 to detect changes in the charge accumulated on the test workpiece 300. Rather than generating an OES graph as shown in FIG. 4A, the workpiece bias power supply 180 may output a set of charges or currents as a function of scan position. Specifically, the graph of charge or current may be similar to the line 400 in FIG. 4A, where the amount of charge increases as the aspect ratio becomes smaller. At a certain scan position, the aspect ratio is sufficiently small so that a further decrease in that aspect ratio does not result in any additional charge accumulating on the test workpiece 300. The controller 160 may then use this data to create the graph shown in FIG. 4B.

Other structures may be used to detect the central angle of the ion beam 106 as well. For example, in another embodiment, the lower portion 312 of the wall 311 is made of a different material than the top portion 313 of the wall 311. Additionally, the lower portion 312 of the wall 311 may be constructed from the same material as the remainder of the test workpiece 300.

Thus, the system 1 of FIG. 1 may be used with test workpieces having different detection patterns to determine various parameters of the ion beam 106. The test workpiece 200 of FIG. 2A may be used to determine the height of the ion beam 106. The test workpiece 220 of FIG. 2B may be used to determine the uniformity of the ion beam 106. The test workpiece 300 of FIG. 3A may be used to determine the central angle of the ion beam 106. Further, the system 1 of FIG. 1 may use either a workpiece bias power supply 180 or the OES system 190 to perform the measurements used to determine these parameters.

Additionally, the OES system 190 and the workpiece bias power supply 180 may be considered to be systems that are capable of measuring the amount of current from the ion beam 106 that strikes the detection pattern. The OES system 190 measures the amount of current by evaluating the spectral emissions from the plasma 140. The workpiece bias power supply 180 measures the amount of current by determining an amount of charge or current that is flowing to or from the workpiece bias power supply 180. The measurements collected by the OES system 190 and/or the workpiece bias power supply 180 may be used by the controller 160 to determine a parameter of the ion beam 106.

While FIGS. 1, 2A-2B, and 3A-3D show the use of a workpiece with a detection pattern, such as a horizontal detection stripe 210, detection areas 221, or trenches 310, other embodiments are also possible.

Figure 5:
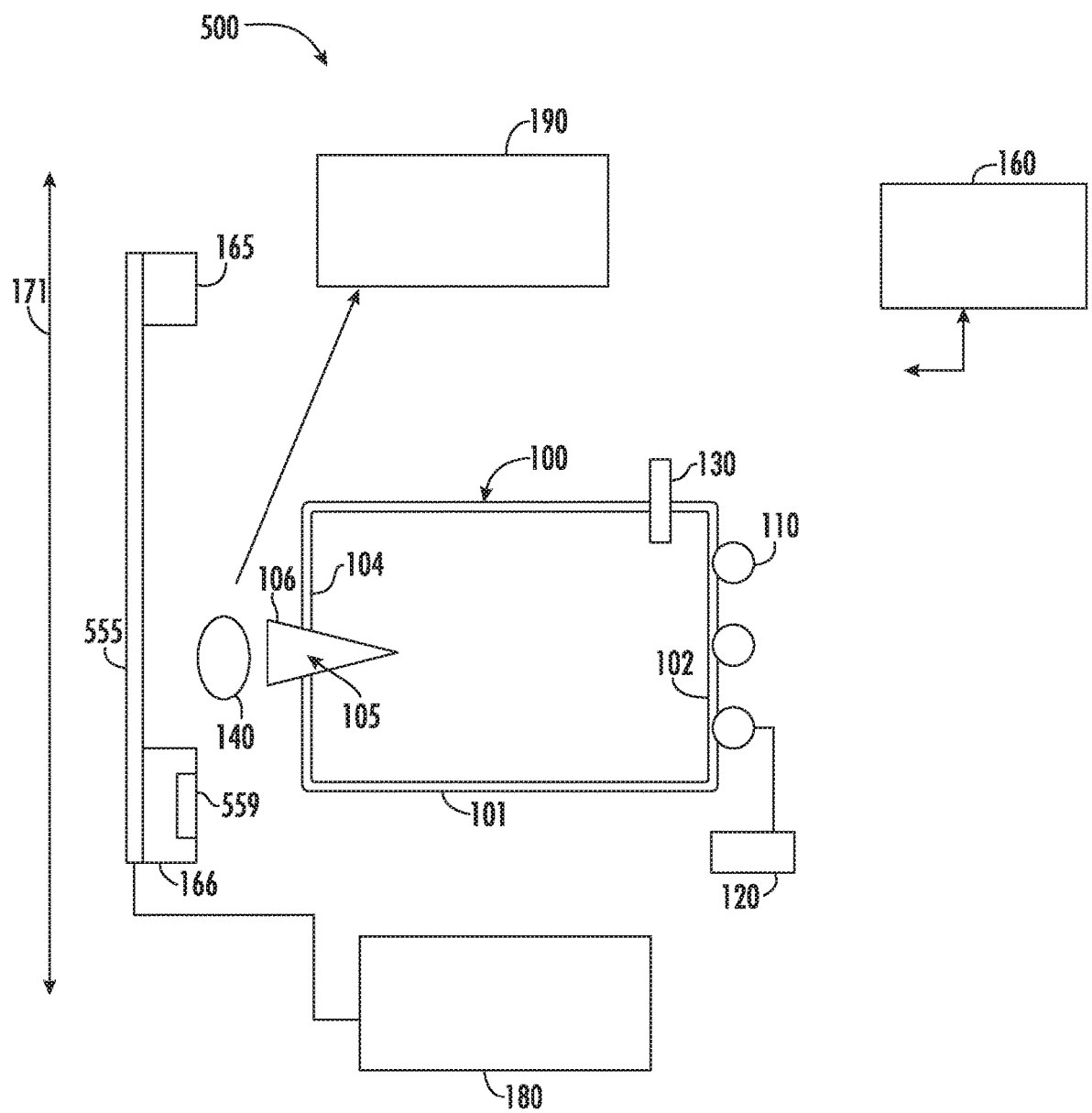
FIG. 5 is a view of the ion source according to a second embodiment.

FIG. 5 shows a system 500, which is similar to that shown in FIG. 1. Components performing the same function have been given identical reference designators. The difference is that, in FIG. 5, the workpiece holder 555 comprises the detection pattern. For example, in one embodiment, the shield 165, which is a part of the workpiece holder 555, may include the detection pattern. The shield 165 may include a first portion that surrounds the workpiece and serves to maintain constant pressure in front of the ion source as the workpiece is scanned. There may also be a second portion 166 of the shield 165 that is positioned beneath the workpiece that may be used for beam measurement. In another embodiment, the second portion 166 may be disposed above the workpiece.

In this embodiment, the second portion 166 of the shield 165 may be scanned in front of the ion beam 106 in order to perform the beam metrology measurements.

Figure 6A:
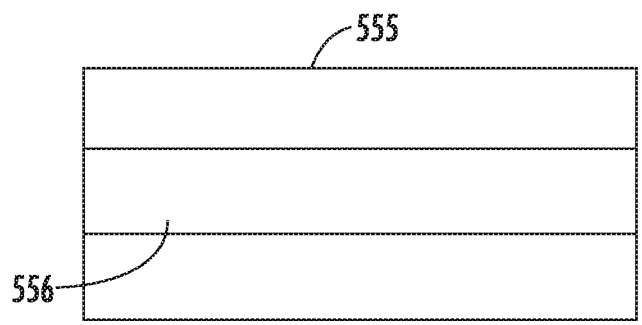
FIG. 6A is a representative view of a workpiece holder used to determine the height of an ion beam.
Figure 6B:
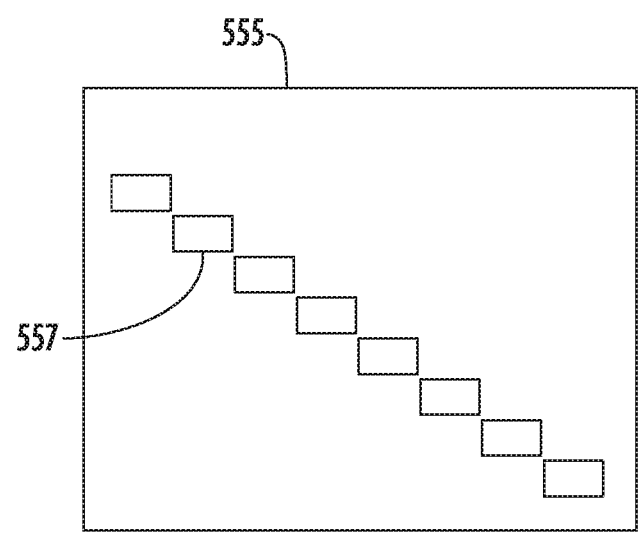
FIG. 6B is a representative view of a workpiece holder used to determine the uniformity of an ion beam.
Figure 6C:
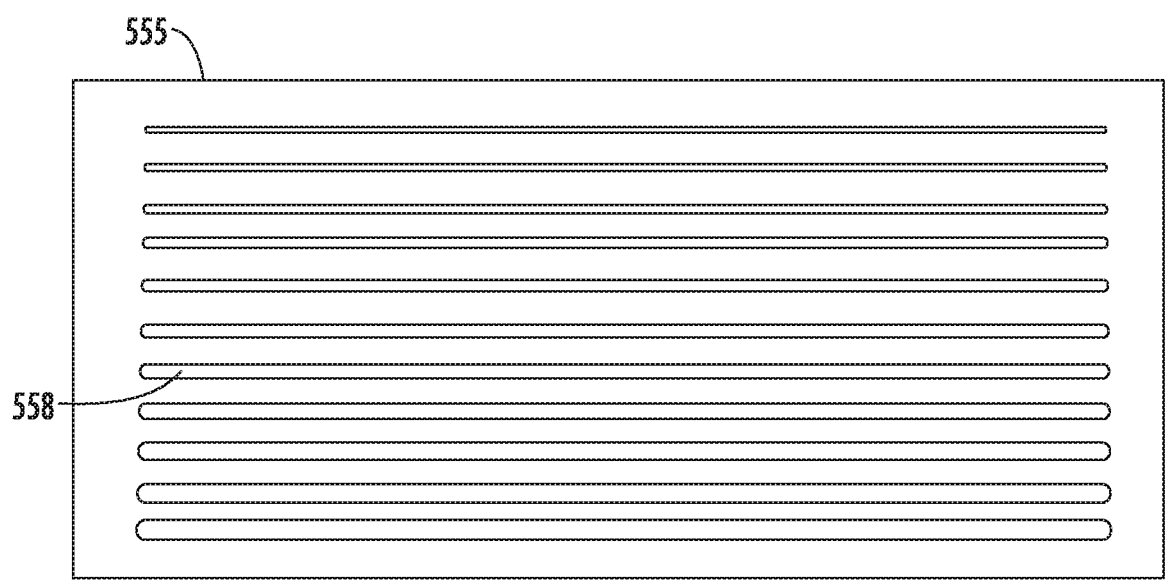
FIG. 6C is a representative view of a workpiece holder used to determine the central angle of an ion beam.

Thus, in this system 500, a workpiece need not be disposed on the workpiece holder 555 in order to perform the ion beam height, uniformity, and central angle tests described above. Rather, the detection patterns 559 are simply embedded in the workpiece holder 555, as shown in FIGS. 6A-6C. In certain embodiments, the detection patterns 559 are disposed on the second portion 166 of the shield 165, as shown in FIG. 5. FIG. 6A shows the workpiece holder 555 with a horizontal detection stripe 556 disposed in it. FIG. 6B shows the workpiece holder 555 with multiple detection areas 557. FIG. 6C shows the workpiece holder 555 with the trenches 558 of varying widths. These detection patterns are employed in the same manner as was described above with respect to FIGS. 2A-2B and FIG. 3. The controller 160 may perform the same operations as described above with respect to FIG. 1.

In these embodiments, the workpiece holder 555 may be a ceramic platen. A workpiece may or may not be disposed on the workpiece holder 555 during the measurement process.

The detection pattern 559 may be constructed from same materials that were used for the embodiment shown in FIG. 1. For example, in FIG. 1, a silicon workpiece utilized a detection pattern made of silicon oxide. In one embodiment, the second portion 166 of the shield 165 may be a silicon plate that has a detection pattern made from silicon oxide (or quartz).

Figure 7:
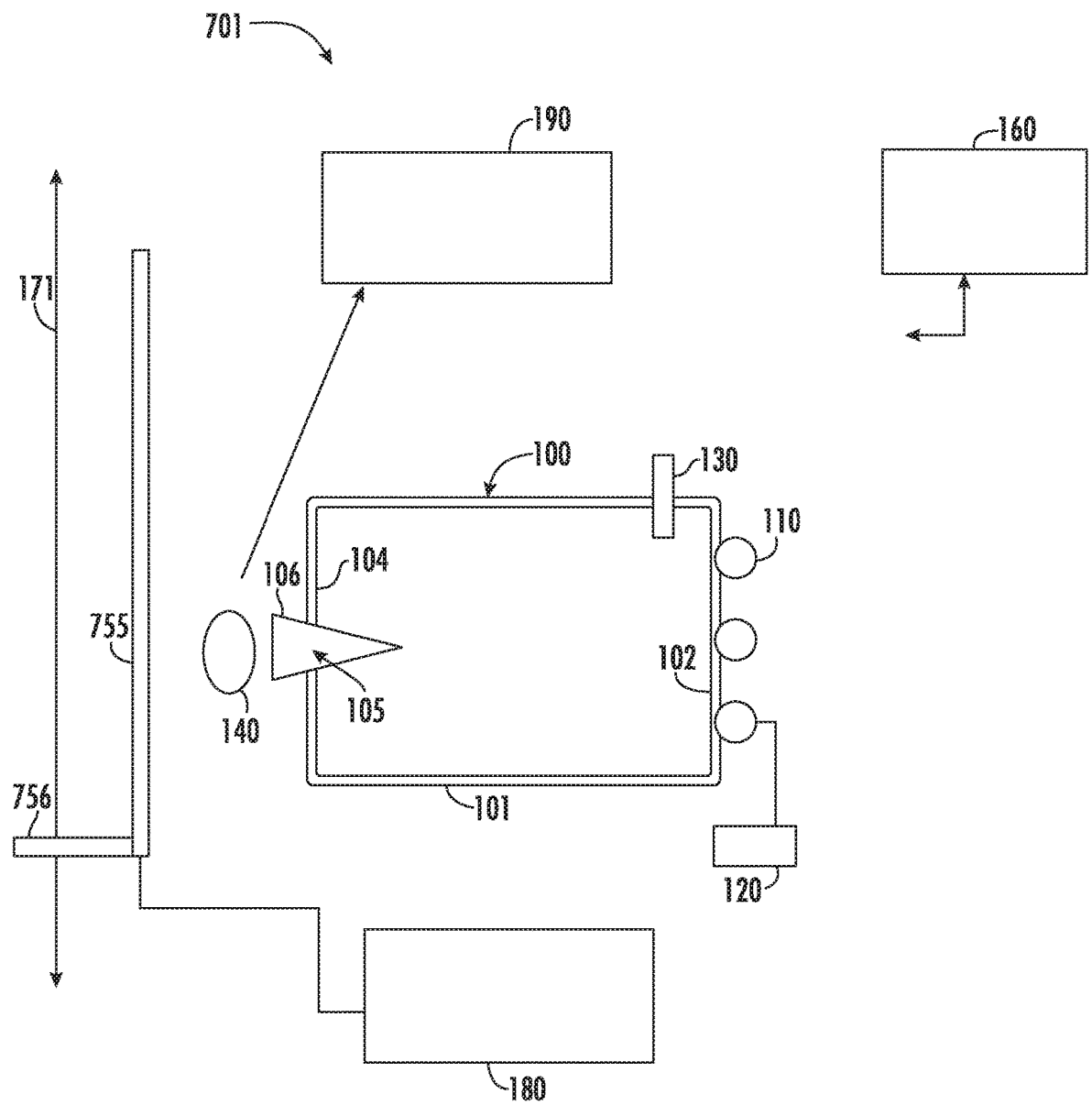
FIG. 7 is a view of the ion source according to a third embodiment.

FIG. 7 shows a system 701, which may be used to determine the angular spread of the ion beam 106. This system 701 is similar to that shown in FIG. 5. Components performing the same function have been given identical reference designators. In this embodiment, the workpiece holder 755 also comprises a leg 756 that extends perpendicular to the surface of the workpiece holder 755. In certain embodiments, the leg 756 extends in a direction that is away from the ion source chamber 100, such as in the Z direction. This leg 756 may be considered a detection pattern in that it is used to detect the impact of the ion beam 106.

The leg 756 may be constructed from a material that is different from the workpiece or the workpiece holder 755. For example, as described above, the workpiece holder 755 may be ceramic, and the leg 756 may be a different material. In some embodiments, the leg 756 may be constructed from the same material as a workpiece, such as, for example, silicon.

In one embodiment, the workpiece bias power supply 180 is used to determine the amount of charge that accumulates on the leg 756. For example, the workpiece holder 755 may be able to rotate about an axis that is parallel to the X axis. As the workpiece holder 755 rotates, the leg 756 may avoid the ion beam 106, or be impacted by the ion beam 106 to a greater extent. FIGS. 8A-8C show three different scenarios. In these scenarios, it may be assumed that the ion beam 106 has an angular distribution that has a central angle $\theta$ relative to the horizon. In FIG. 8A, the workpiece holder 755 is maintained in a vertical position. In this position, some beamlets from the ion beam 106 strike the leg 756, as shown. As the workpiece holder 755 is rotated in the clockwise direction, the angle that the leg 756 forms with the horizon approaches the central angle $\theta$. In FIG. 8B, the leg 756 forms an angle $\theta$ with the horizon. Since the leg 756 is now parallel to the central angle $\theta$, the ion beam 106 no longer strikes the leg 756. Conversely, as the workpiece holder 755 is rotated in the counterclockwise direction, the angle that the leg 756 becomes more negative. Consequently, more of the ion beam 106 strikes the leg 756.

The workpiece bias power supply 180 may transmit this information to the controller 160, which may measure the charge accumulated on the leg 756. As the workpiece holder 755 is rotated, the charge accumulated varies as a function of rotational angle. The workpiece bias power supply 180 may provide this information to the controller 160. The controller 160 is also in communication with the workpiece holder 755 so as to know the rotational angle. Using this information, the controller 160 may determine a relationship between the rotational angle and the charge accumulated. Based on this data, the controller may determine the central angle $\theta$ of the ion beam 106.

Alternatively, the OES system 190 may be used to determine the central angle of the ion beam 106. In one embodiment, the leg 756 may be constructed from silicon, and the OES system 190 may detect the spectral emission for silicon. As the workpiece holder 755 is rotated, the spectral emissions vary. This information may be transmitted to the controller 160 which determines a relationship between rotational angle and spectral emissions. Based on this, the controller 160 may determine the central angle of the ion beam 106.

As stated above, the OES system 190 and the workpiece bias power supply 180, either alone or in conjunction with the controller 160, may be considered to be measuring systems that are capable of determining the amount of current from the ion beam 106 that strikes the detection pattern. The OES system 190 measures the amount of current by evaluating the spectral emissions from the plasma 140. The workpiece bias power supply 180 measures the amount of current by determining an amount of charge or current that is flowing to or from the workpiece bias power supply 180. The controller 160 then uses this information to determine the parameters of interest.

While FIGS. 1, 5 and 7 show the ion source chamber 100 disposed proximate the workpiece, other embodiments are also possible. For example, the detection patterns may be disposed on a test workpiece that is employed with a beam-line implantation system as well. Similarly, the workpiece holder used in a beam-line implantation have be modified to include the detection patterns.

Figure 9:
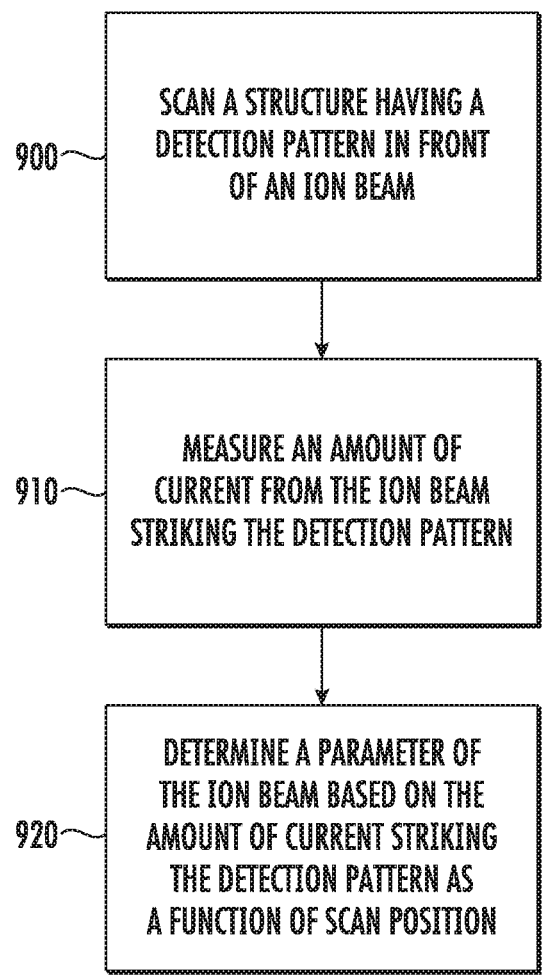
FIG. 9 is a representative flow chart showing a process of determining a parameter of an ion beam.

The present disclosure also describes a method for determining the parameters of an ion beam. This method is shown in FIG. 9. First, a structure having a detection pattern is scanned in front of the ion beam, as shown in Process 900. As described above, the detection pattern is constructed from a material that is different from that used for the structure. In one embodiment, the structure is a workpiece, such as a silicon wafer. The detection pattern may be silicon oxide. In another embodiment, the structure may be the workpiece holder, or more particularly, the second portion of the shield. Again, the workpiece holder may be a ceramic plate and the detection pattern may be silicon oxide. The structure may be scanned in the vertical direction, as described above. In another embodiment, the structure may be scanned in a rotational direction, such as about the X axis.

The amount of current from the ion beam striking the detection pattern is then determined, as shown in Process 910. In certain embodiments, the amount of current striking the detection pattern may be determined using an OES system 190. In other embodiments, a workpiece bias power supply 180 is used to bias the workpiece holder. The workpiece bias power supply 180 provides an indication of the charge accumulated on the workpiece or the workpiece holder. This indication of charge is representative of the amount of current from the ion beam 106 striking the detection pattern.

Once the amount of current striking the detection beam as a function of scanning position is determined, the parameters of the ion beam may be determined, as shown in Process 920. For example, as shown in FIG. 2A, the height of the ion beam may be determined. In another embodiment, as shown in FIG. 2B, the uniformity of the ion beam may be determined. In yet another embodiment, the central angle of the ion beam may be determined. The selection of the detection pattern may allow the determination of these different parameters.

The systems described herein have many advantages. First, in all of the disclosed embodiments, the parameters of the ion beam 106 may be determined without the use of Faraday devices. As stated above, current systems may introduce dielectric or insulating materials into the processing chamber, which may affect the accuracy of Faraday devices. Furthermore, by incorporating detection patterns on the workpiece holder or on a test workpiece, it is possible to determine the parameters of the ion beam at exactly the location where the ion beam impacts a workpiece. This may be more accurate than traditional methods of measuring these parameters.

Furthermore, Faraday devices are typically made from a metal, which may serve as a source of contamination for the workpieces. The use of less problematic materials, such as silicon oxide, reduce the risk of contamination.

Additionally, the present system allows immediate feedback regarding the beam parameters. Some traditional methods of measuring angles or beam height use a process that first etches a structured wafer and then uses external analysis to measure the impact to the etch results to deduce the beam characteristics. These traditional methods take significantly longer to perform.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
an ion source, emitting an ion beam;
a workpiece holder, configured so as to have relative movement between the workpiece holder and the ion beam;
a test workpiece disposed on the workpiece holder, having a detection pattern, wherein the detection pattern is made of a material different than the test workpiece; and
an optical emission spectrometer (OES) system for determining an amount of current from the ion beam striking the detection pattern, wherein an output from the OES system is used to measure a parameter of the ion beam.

2. The workpiece processing system of claim 1, wherein the detection pattern comprises a horizontal detection stripe and the parameter comprises a height of the ion beam.

3. The workpiece processing system of claim 1, wherein the detection pattern comprises a plurality of detection areas, and the parameter comprises a uniformity of the ion beam.

4. The workpiece processing system of claim 3, wherein the plurality of detection areas are non-overlapping in vertical and horizontal directions.

5. The workpiece processing system of claim 1, wherein the detection pattern comprises trenches of varying aspect ratios, and the parameter comprises a central angle of the ion beam.

6. The workpiece processing system of claim 5, each trench comprises two walls, where each wall comprises a lower portion, and an upper portion, wherein the lower portion is made of a material different than the upper portion.

7. The workpiece processing system of claim 1, wherein the test workpiece comprises silicon and the detection pattern comprises silicon oxide or silicon nitride.

8. A workpiece processing system, comprising:
an ion source, emitting an ion beam;
a workpiece holder, configured so as to have relative movement between the workpiece holder and the ion beam, and having a detection pattern, wherein the detection pattern is made of a material different than the workpiece holder; and
an optical emission spectrometer (OES) system for determining an amount of current from the ion beam striking the detection pattern, wherein an output from the OES system is used to measure a parameter of the ion beam.

9. The workpiece processing system of claim 8, wherein the detection pattern comprises a horizontal detection stripe and the parameter comprises a height of the ion beam.

10. The workpiece processing system of claim 8, wherein the detection pattern comprises a plurality of detection areas, and the parameter comprises a uniformity of the ion beam.

11. The workpiece processing system of claim 8, wherein the detection pattern comprise trenches of varying aspect ratios, and the parameter comprises a central angle of the ion beam.

12. The workpiece processing system of claim 8, wherein the detection pattern comprises a leg disposed perpendicular to a surface of the workpiece holder, and the parameter comprises a central angle of the ion beam.

13. A method of determining a parameter of an ion beam, comprising:
- scanning a structure having a detection pattern in front of the ion beam, wherein the detection pattern is made of a different material than the structure;
- measuring an amount of current from the ion beam striking the detection pattern using an OES system; and
- determining the parameter based on the amount of current striking the detection pattern as a function of scan position.

14. The method of claim 13, wherein the structure comprises a silicon workpiece.

15. The method of claim 13, wherein the structure comprises a workpiece holder.

16. The method of claim 13, wherein the parameter is selected from the group consisting of height, uniformity and central angle.

17. A workpiece processing system, comprising:
- an ion source, emitting an ion beam;
- a workpiece holder, configured so as to have relative movement between the workpiece holder and the ion beam;
- a test workpiece disposed on the workpiece holder, having a detection pattern, wherein the detection pattern is made of a material different than the test workpiece; and
- a measuring system for determining an amount of current from the ion beam striking the detection pattern, wherein an output from the measuring system is used to measure a parameter of the ion beam, wherein the measuring system comprises a workpiece bias power supply used to bias the test workpiece, and wherein the workpiece bias power supply provides an indication of charge accumulated on the test workpiece or an indication of current flowing to or from the workpiece bias power supply, wherein the indication is representative of the amount of current from the ion beam striking the detection pattern.

18. The workpiece processing system of claim 17, wherein the detection pattern comprises a horizontal detection stripe and the parameter comprises a height of the ion beam.

19. The workpiece processing system of claim 17, wherein the detection pattern comprises a plurality of detection areas, and the parameter comprises a uniformity of the ion beam.

20. The workpiece processing system of claim 19, wherein the plurality of detection areas are non-overlapping in vertical and horizontal directions.

21. The workpiece processing system of claim 17, wherein the detection pattern comprises trenches of varying aspect ratios, and the parameter comprises a central angle of the ion beam.

22. The workpiece processing system of claim 21, each trench comprises two walls, where each wall comprises a lower portion, and an upper portion, wherein the lower portion is made of a material different than the upper portion.

23. The workpiece processing system of claim 17, wherein the test workpiece comprises silicon and the detection pattern comprises silicon oxide or silicon nitride.

24. A workpiece processing system, comprising:
- an ion source, emitting an ion beam;
- a workpiece holder, configured so as to have relative movement between the workpiece holder and the ion beam, and having a detection pattern, wherein the detection pattern is made of a material different than the workpiece holder; and
- a measuring system for determining an amount of current from the ion beam striking the detection pattern, wherein an output from the measuring system is used to measure a parameter of the ion beam, wherein the measuring system comprises a workpiece bias power supply used to bias the workpiece holder, and wherein the workpiece bias power supply provides an indication of charge accumulated on the workpiece holder or an indication of current flowing to or from the workpiece bias power supply, wherein the indication is representative of the amount of current from the ion beam striking the detection pattern.

25. The workpiece processing system of claim 24, wherein the detection pattern comprises a horizontal detection stripe and the parameter comprises a height of the ion beam.

26. The workpiece processing system of claim 24, wherein the detection pattern comprises a plurality of detection areas, and the parameter comprises a uniformity of the ion beam.

27. The workpiece processing system of claim 24, wherein the detection pattern comprise trenches of varying aspect ratios, and the parameter comprises a central angle of the ion beam.

28. The workpiece processing system of claim 24, wherein the detection pattern comprises a leg disposed perpendicular to a surface of the workpiece holder, and the parameter comprises a central angle of the ion beam.

29. A method of determining a parameter of an ion beam, comprising:
- scanning a structure having a detection pattern in front of the ion beam, wherein the detection pattern is made of a different material than the structure;
- measuring an amount of current from the ion beam striking the detection pattern using a workpiece bias power supply; and
- determining the parameter based on the amount of current striking the detection pattern as a function of scan position.

30. The method of claim 29, wherein the structure comprises a silicon workpiece.

31. The method of claim 29, wherein the structure comprises a workpiece holder.

32. The method of claim 29, wherein the parameter is selected from the group consisting of height, uniformity and central angle.

* * * * *